(12) United States Patent
Lai

(10) Patent No.: US 6,680,982 B1
(45) Date of Patent: Jan. 20, 2004

(54) JITTER-TOLERANT SIGNAL RECEIVER AND METHOD OF DESIGNING THE SAME

(75) Inventor: Ching-Chang Lai, Taipei (TW)

(73) Assignee: Via Technologies, Inc., Taipei (TW)

( * ) Notice: Subject to any disclaimer, the term of this patent is extended or adjusted under 35 U.S.C. 154(b) by 651 days.

(21) Appl. No.: 09/628,343

(22) Filed: Jul. 28, 2000

(30) Foreign Application Priority Data

Sep. 10, 1999 (TW) .......................... 88115692 A (51) Int. Cl.[7] .................. H04L 27/06; H04L 25/00
(52) U.S. Cl. ........................ 375/316; 375/371
(58) Field of Search ................. 375/316, 371, 375/373, 376; 327/141, 142

(56) References Cited

U.S. PATENT DOCUMENTS 6,178,216 B1 * 1/2001 Lee .......................... 375/376
6,501,312 B1 * 12/2002 Nguyen .................... 327/161

* cited by examiner

Primary Examiner—Tesfaldet Bocure (57) ABSTRACT

A jitter-tolerant signal receiver and a method of designing a jitter-tolerant signal receiver requiring only three D flip-flops. The jitter-tolerant signal receiver receives an input signal of a first clock domain and outputs a sampling event signal of a second clock domain in a communication system. The jitter-tolerant signal receiver includes a first D flip-flop, a second D flip-flop, and a third D flip-flop. The first D flip-flop receives the input signal at a first input terminal and a first clock at a first clock terminal and outputs a first event signal at a first output terminal. The second D flip-flop receives a high level signal at a second input terminal and the first event signal at a second clock terminal and outputs a second event signal at a second output terminal. The third D flip-flop for receives the second event signal at a third input terminal and a second clock of the second domain at a third clock terminal, and outputs the sampling event signal at a third output terminal. The second D flip-flop further includes a reset terminal for receiving the sampling event signal. The jitter due to interference during transmission can be eliminated and data transmitting and receiving can be accomplished accurately. The number of components in the invention is few and simple circuits achieve the goal with good performance.

15 Claims, 8 Drawing Sheets

FIG.8 though the OR gate 510 may still fail to be sampled.

JITTER-TOLERANT SIGNAL RECEIVER AND METHOD OF DESIGNING THE SAME

BACKGROUND OF THE INVENTION

This application incorporates by reference Taiwanese application Serial No. 88115692, Filed Sep. 10, 1999

FIELD OF THE INVENTION

The invention relates in general to a jitter-tolerant signal receiver and a method of designing a jitter-tolerant signal receiver, and more particularly to a jitter-tolerant signal receiver applied in a communication system of two different clock domains.

DESCRIPTION OF THE RELATED ART

Communication systems consisting of a transmitter and receiver have a common problem of incompatibility of their respective frequency domains. The system clock of the transmitter differs from that of the receiver in frequency or phase. As a result, a Phase Lock Loop (PLL) is used to recover the clock of the transmitter in the receiver. Therefore, a receiving clock is generated, which has the same frequency but probably different phase as compared to the system clock of the receiver. Thus, the sampling of data and transmission of data signal can be easily performed.

In the receiver, the regular system clock can be obtained by first producing a regular unit clock using crystal oscillation and then directly dividing the resulting regular unit clock. The unit clock is used to lock the incoming data and the system clock is used for clocking logic circuit. However, the receiving clock generated by the PLL often suffers from severe jitters due to clock drift. This jitter in the receiving clock may result in data loss and so the prevention of data loss due to jitter is an important subject nowadays.

Figure 1:
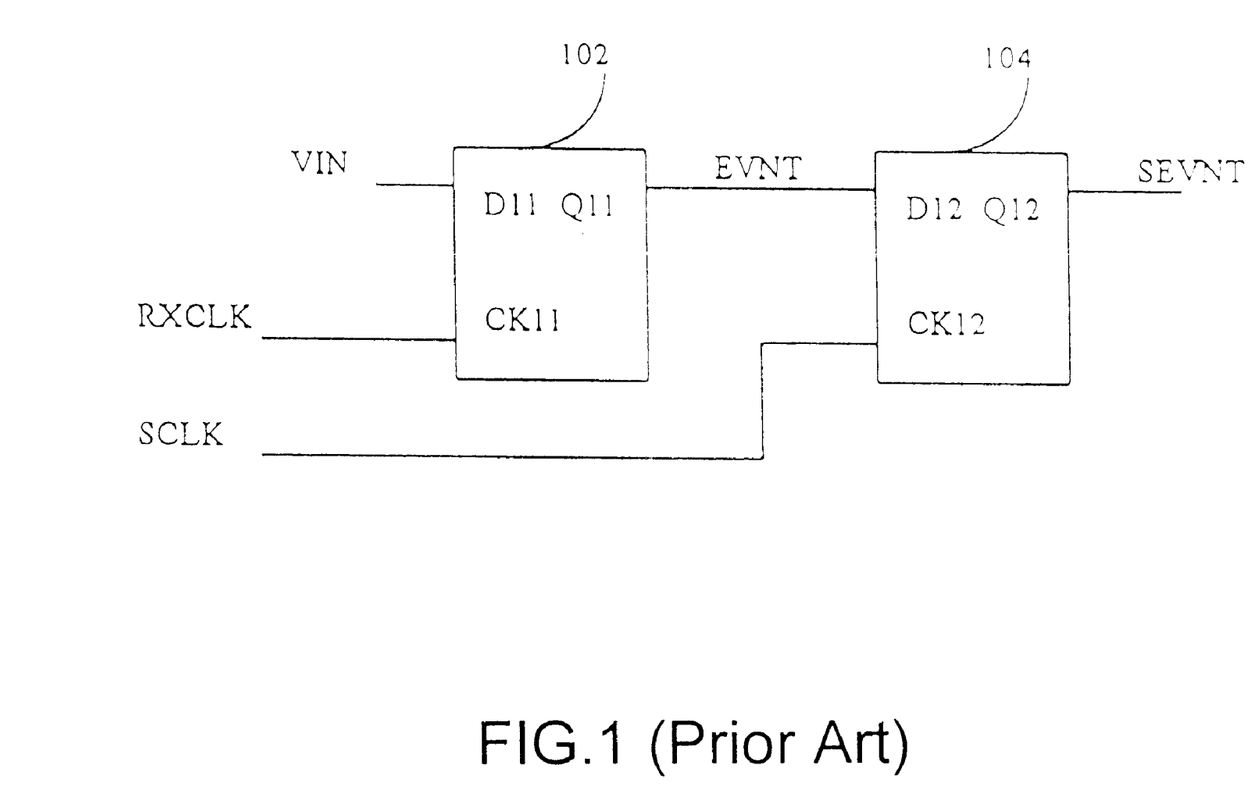
FIG. 1 (Prior Art) depicts, in block diagram form, a traditional signal receiver.

Referring to FIG. 1, a block diagram of a traditional signal receiver is illustrated. An input signal VIN is inputted to an input terminal D11 of D flip-flop 102, and a receiving clock RXCLK is inputted to a clock input terminal CK11 of D flip-flop 102. The input signal VIN is sampled at the rising edge of the receiving clock RXCLK and an event signal EVNT of the same logic level as the input signal VIN is outputted from an output terminal Q11 of D flip-flop 102. Next, the event signal EVNT is inputted into an input terminal D12 of D flip-flop 104, and a system clock SCLK is inputted to a clock input terminal CK12 of D flip-flop 104. A sampling event signal SEVNT is then outputted from an output terminal Q12 of D flip-flop 104. These D flip-flops, for example, are of positive edge-triggered.

Figure 2:
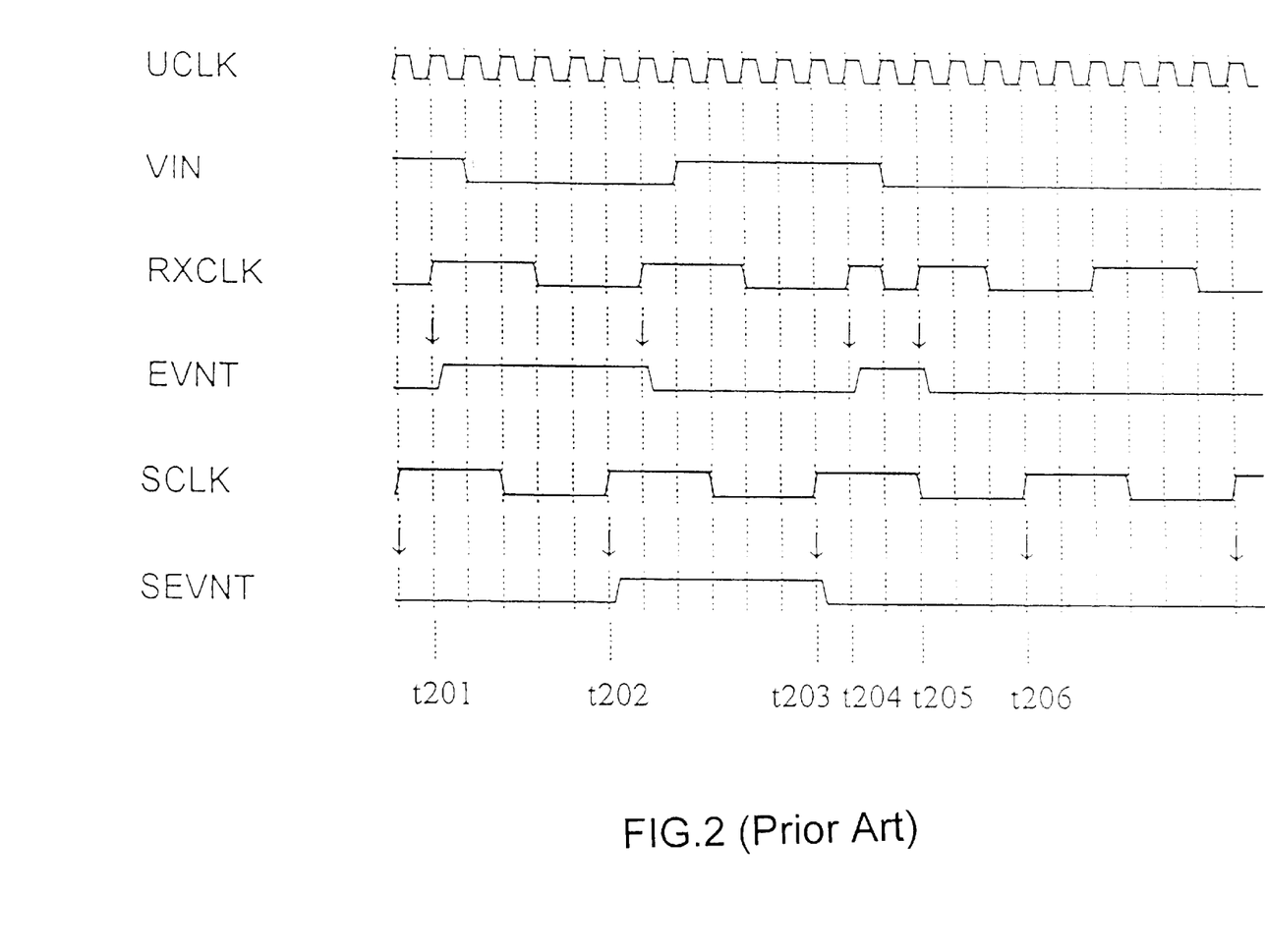
FIG. 2 (Prior Art) shows a timing diagram of the signal receiver in FIG. 1.

FIG. 2 is a timing diagram of the signal receiver in FIG. 1. Referring to FIG. 1 and FIG. 2 at the same time, a unit clock UCLK, which can be produced by crystal oscillation, is divided to produce a system clock SCLK. As the receiving clock RXCLK changes from low level to high level, the D-flip-flop 102 transfers the input signal VIN to the event signal EVNT. At t201, for example, the D-flip-flop 102 transfers the high level input signal VIN to the event signal EVNT at the rising edge of the receiving clock RXCLK, which changes from low to high.

Similarly, when a rising edge of the system clock SCLK occurs, the event signal EVNT is transferred to the sampling event signal SEVNT and then the sampling event signal SEVNT holds for a period of the system clock SCLK in the D flip-flop 104. At t202, for example, upon a rising edge of system clock SCLK, the high level event signal EVNT is transferred to the sampling signal SEVNT which is then retained at the same level with the event signal EVNT for a period of system clock SCLK.

Therefore, through the D flip-flop 102, the input signal VIN is transferred to the event signal EVNT which has the same period as the receiving clock RXCLK. After processing the event signal EVNT through the D flip-flop 104, a sampling event signal SEVNT with the same period as the system clock SCLK is obtained.

However, an event, which represents logic 1 of the corresponding signal, can be lost due of the occurrence of jitters in the clock. For example, when a jitter occurs in the receiving clock RXCLK, the event of event signal EVNT may be retained at a high level only for a short moment, say from t204 to t205. As a result, the event of event signal EVNT, which is retained at high level from t204 to t205, can not be sampled at t203 or t206 and can not be transferred to the sampling event signal SEVNT. The event of event signal EVNT is thus lost.

Figure 3:
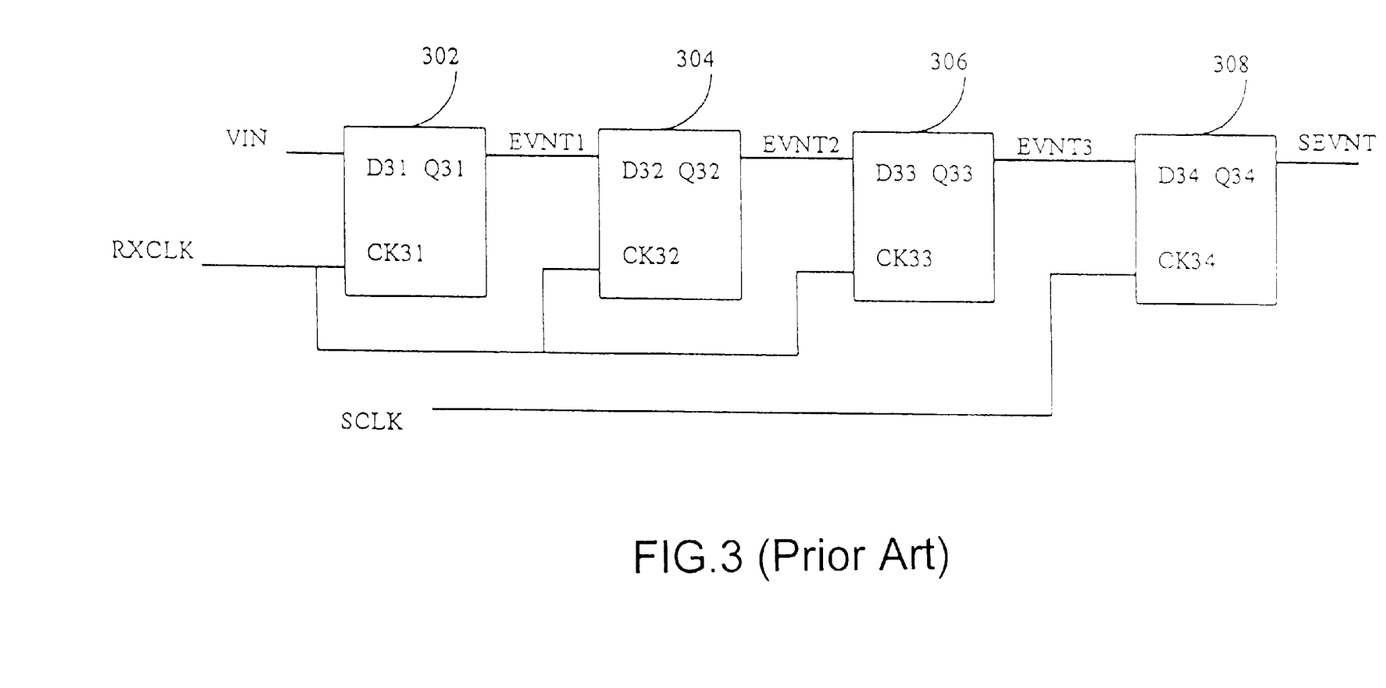
FIG. 3 (Prior Art) shows the block diagram of a traditional jitter-tolerant signal receiver.

One of traditional methods for solving this problem is to use a signal receiver with four D flip-flops. Referring to FIG. 3, the block diagram of a traditional jitter-tolerant signal receiver is illustrated. First, a receiving signal RXCLK is fed to the clock terminals CK31, CK32, and CK33 of D flip-flop 302, 304, and 306 respectively. Next, an input signal VIN is applied to the input terminal D31, and an event signal EVNT1 is outputted from an output terminal D31 in the D flip-flop 302. The event signal EVNT1 is then fed to the input terminal D32, and an event signal EVNT2 is outputted from the output terminal Q32 in the D flip-flop 304. Following that, the event signal EVNT2 is applied to a input terminal D33, and an event signal EVNT3 is outputted from a output terminal Q33 in D flip-flop 306. Aside from the event signal EVNT3 being inputted to the input terminal D34, a system clock SCLK is fed to the clock terminal CK34 in the D flip-flop 308 simultaneously. Finally, the output terminal Q34 of the D flip-flop 308 outputs a sampling event signal SEVNT that is transferred from the input signal VIN.

Figure 4:
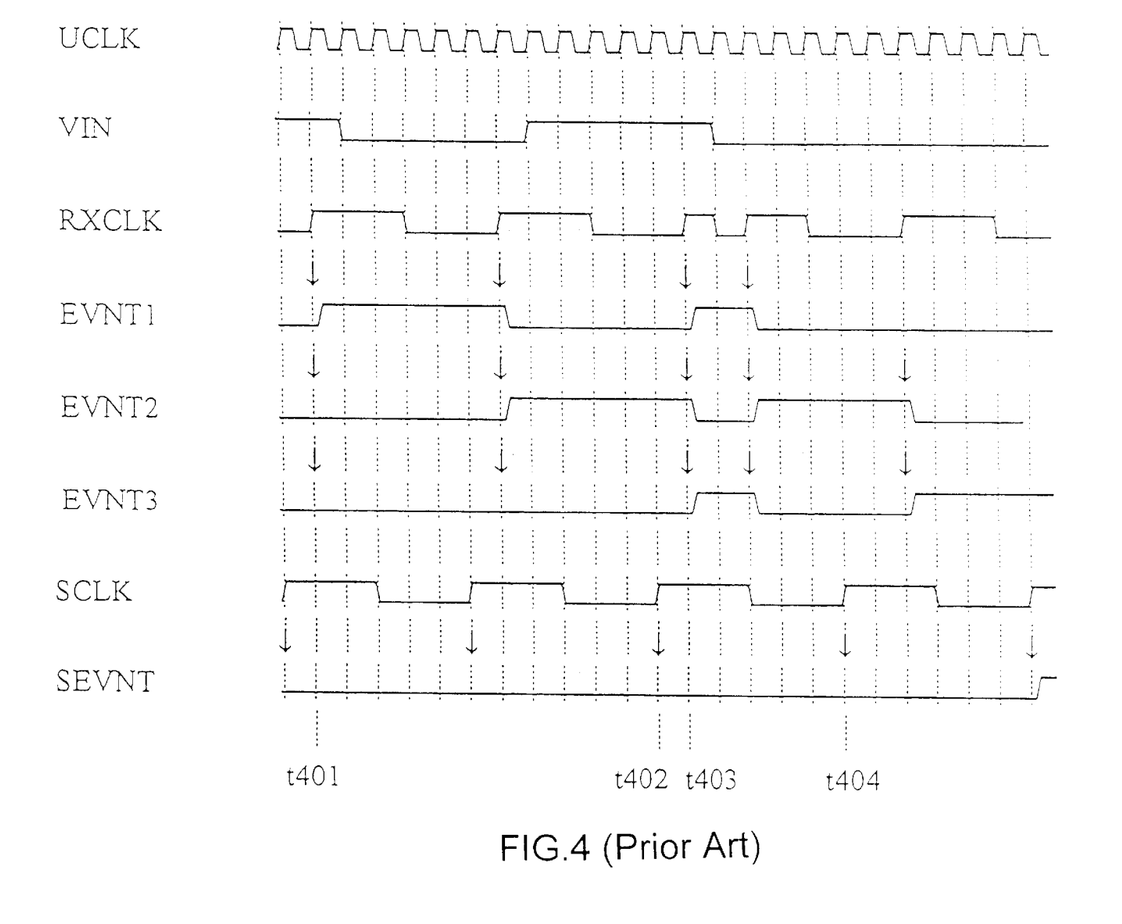
FIG. 4 (Prior Art) shows the timing diagram of the traditional jitter-tolerant signal receiver in FIG. 3.

FIG. 4 is the timing diagram of the traditional jitter-tolerant signal receiver in FIG. 3. Referring to FIG. 3 and FIG. 4 at the same time, at t401, the input signal VIN of high level is transferred to the event signal EVNT1 which retains it in high level for the period of receiving signal RXCLK in the D flip-flop 302. Due to a jitter in the receiving clock RXCLK starting at t403, the event signal EVNT1 can only be sustained in high level for the period of the jitter. In D flip-flop 304 and 306, the event signal EVNT2 is retained in low level and the event signal EVNT3 is retained in high level only for the period of the jitter.

However, at t403, the period of the event of event signal EVNT3 is too short to be sampled by the D flip-flop 308 at the adjacent positive edge of t402 and t404. So the event is lost when transferred to the sampling event signal SEVNT in D flip-flop 308.

Figure 5:
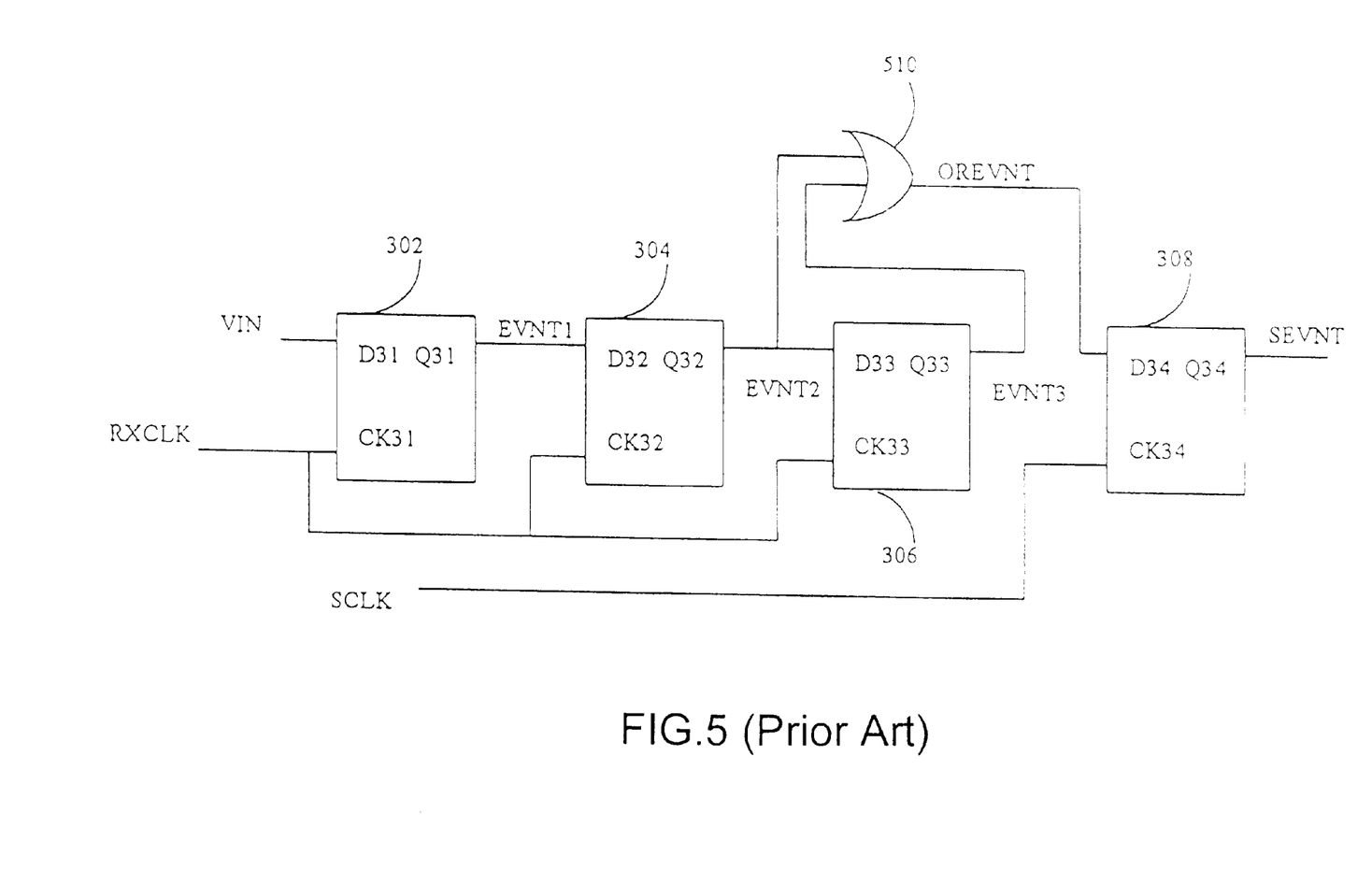
FIG. 5 (Prior Art) shows a block diagram of another traditional jitter-tolerant receiver.

Another method of solving this problem is to add an OR gate to avoid missing signals in FIG. 3. Referring to FIG. 5, which is a block diagram of another traditional jitter-tolerant receiver, the event signal EVNT2 and event signal EVNT3 are fed to an OR gate 510 and an OR signal (OREVNT) is then outputted from the OR gate 510 and applied to an input terminal D34 in the D flip-flop 308.

Figure 6:
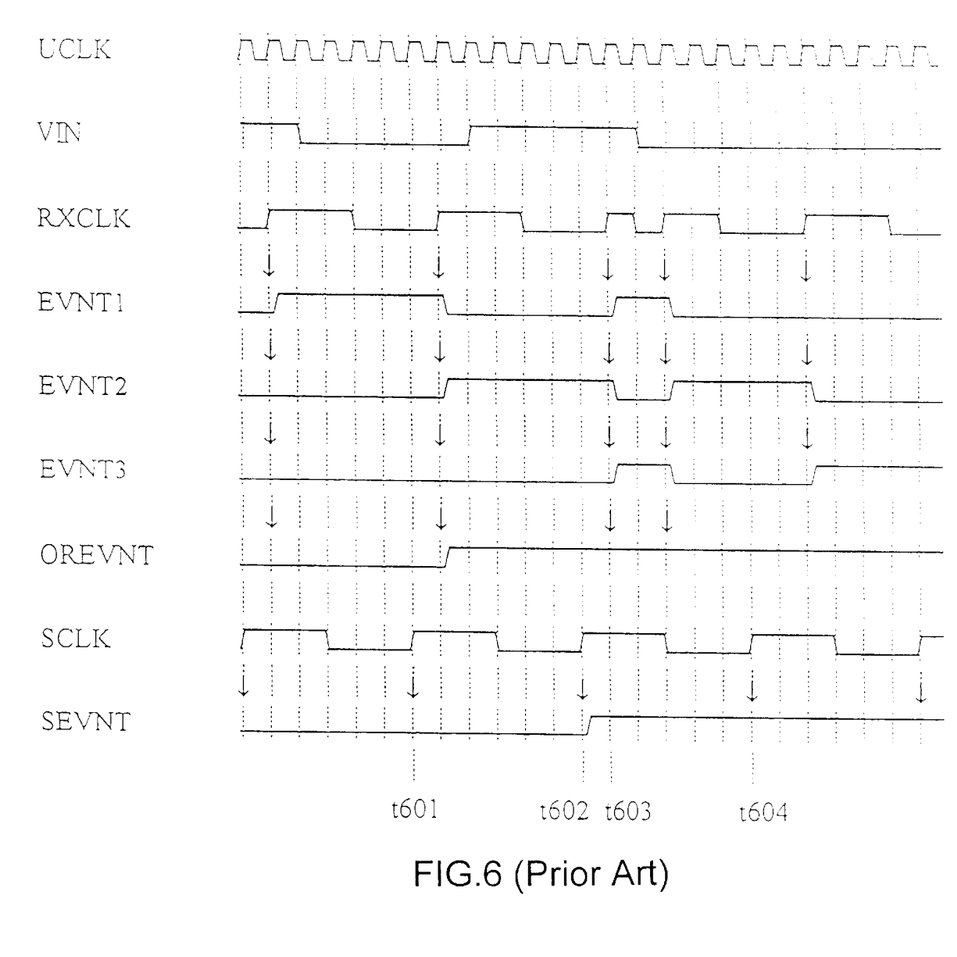
FIG. 6 (Prior Art) shows the timing diagram of the traditional jitter-tolerant receiver in FIG. 5.

The timing diagram of the traditional jitter-tolerant receiver in FIG. 5 is illustrated in FIG. 6. The OR signal OREVNT results from an OR operation on the event signals ENVN2 and EVNT3. However, if the events in input signal VIN are too close to each other, the events transferred from the input signal VIN to OR signal OREVNT might be indistinguishable. An example is diagrammed in FIG. 6; after t601, the OR signal OREVNT is in high level for more than ten periods of unit clock UCLK. Similarly, the sampling event signal SEVNT is in high level after t602. Two events in the input signal VIN are combined to one event in the sampling event signal SEVNT and indistinguishable from each other. Consequently, more complicated circuit is needed to handle this type of situations. If the jitter becomes more severe or a receiving clock RXCLK of lower frequency is used, the logic circuit needed would be more difficult to be designed.

SUMMARY OF THE INVENTION

It is therefore an object of the invention to provide a jitter-tolerant signal receiver and a method of designing a jitter-tolerant signal receiver, requiring only three D flip-flops. Thus, the jitter can be eliminated and data transmitting and receiving can be accomplished accurately. The number of components in the invention is few and simple circuits achieve the goal with good performance.

The invention achieves the above-identified objects by providing a jitter-tolerant signal receiver, for receiving an input signal of a first clock domain and outputting a sampling event signal of a second clock domain in a communication system. The jitter-tolerant signal receiver includes a first D flip-flop, a second D flip-flop, and a third D flip-flop. The first D flip-flop receives the input signal at a first input terminal and a first clock signal at a first clock terminal and outputs a first event signal at a first output terminal. The second D flip-flop receives a high level signal at a second input terminal and the first event signal at a second clock terminal and outputs a second event signal at a second output terminal. The third D flip-flop for receives the second event signal at a third input terminal and a second clock of the second domain at a third clock terminal, and outputs the sampling event signal at a third output terminal. Beside that, the second D flip-flop further includes a reset terminal for receiving the sampling event signal.

It is another object of the invention to provide a method of designing a jitter-tolerant signal receiver, for receiving an input signal of a first clock domain and outputting a sampling event signal of a second clock domain. The method of designing includes the following steps. First, the input signal is inputted to a first D flip-flop which is clocked by a first clock of the first clock domain. When the first clock changes from a first level to a second level, the input signal is transferred to a first signal which is outputted from the first D flip-flop. Second, a second signal of the first level is inputted to a second D flip-flop which is clocked by the first signal. When the first signal changes from the first level to the second level, the second signal is transferred to a third signal which is outputted from the second D flip-flop. Third, the third signal is inputted to a third D flip-flop which is clocked by a second clock of the second clock domain. When the second clock changes from the first level to the second level, the third signal is transferred to the sampling event signal which is outputted from the third D flip-flop. Finally, the sampling event signal is inputted to a reset terminal of the second D flip-flop. When the sampling event signal is of the first level, the third signal changes to the second level.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 7:
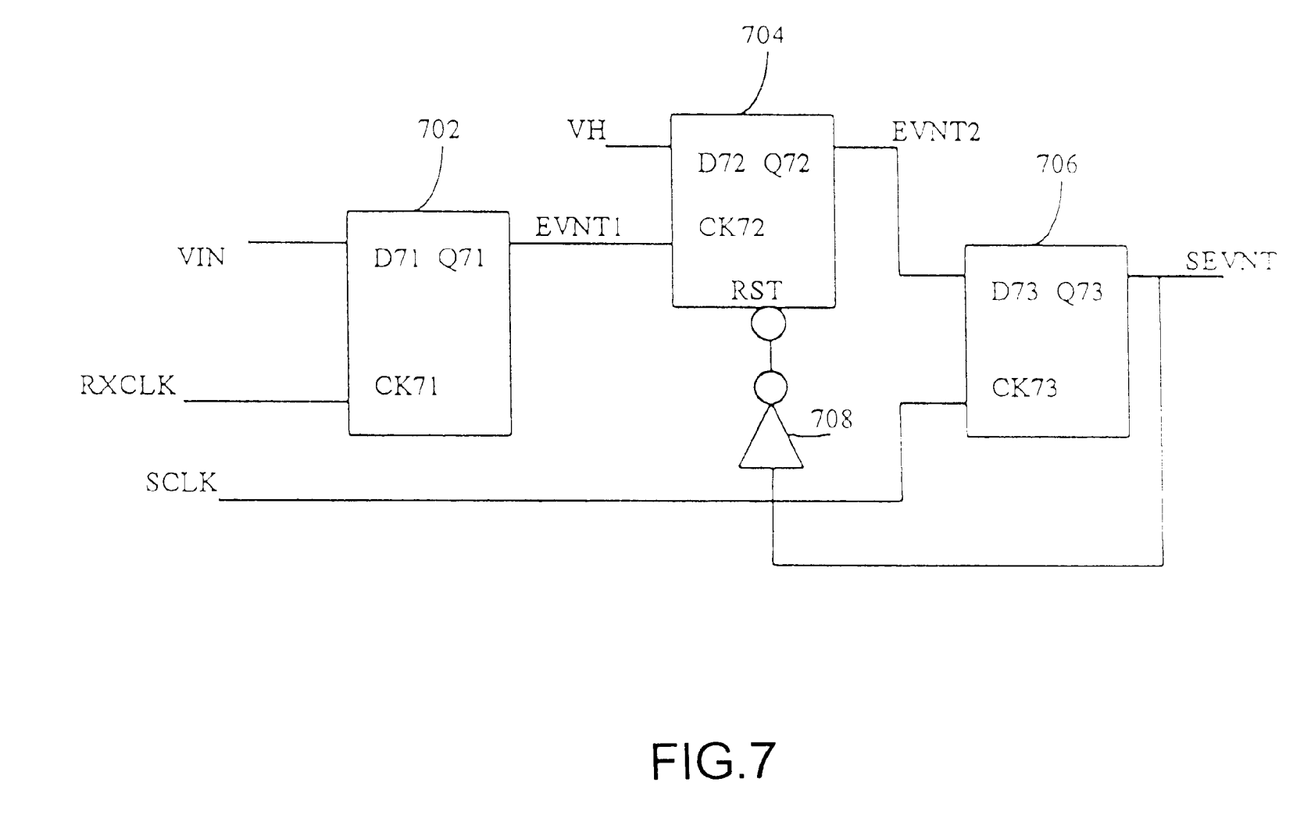
FIG. 7 depicts a block diagram of the jitter-tolerant receiver according to the preferred embodiment of the invention.

FIG. 7 depicts a block diagram of the jitter-tolerant receiver according to the preferred embodiment of the invention. The embodiment of the invention is illustrated by taking examples of positive edge-triggered D flip-flops and assuming that the enable signal is high level. The D flip-flops samples the input signals in the input terminals and transfers them to the output terminals when the clock signals in the clock terminals of the D flip-flops change from low level to high level. Apparently, setting low level as enable signal is also within the spirit of the invention.

An input signal VIN is applied to an input terminal D71 of D flip-flop 702 and a receiving clock RXCLK is inputted to the clock terminal CK71 of D flip-flop 702. The D flip-flop 702 transfers the input signal VIN to event signal EVNT1 and the event signal EVNT1 is outputted at an output terminal Q71 on the positive-going edge of the receiving clock RXCLK. After that, the event signal EVNT1 is applied to a clock terminal CK72 of D flip-flop 704 and a high level signal VH is inputted to an input terminal D72 of D flip-flop 704. Next, the D flip-flop 704 outputs an event signal EVNT2 from an output terminal Q72. Event signal EVNT2 is then fed to an input terminal D73 of D flip-flop 706, and a system clock SCLK is inputted to the clock terminal CK73 of D flip-flop 706. Following that, D flip-flop 706 outputs a sampling event signal SEVNT from an output terminal Q73. Finally, the sampling event signal SEVNT is fed back to a reset terminal RST of D flip-flop 704 through an inverter 708. As such, when the sample event SEVNT changes to high level, the D flip-flop 704 resets and the event signal EVNT2 becomes low level.

Figure 8:
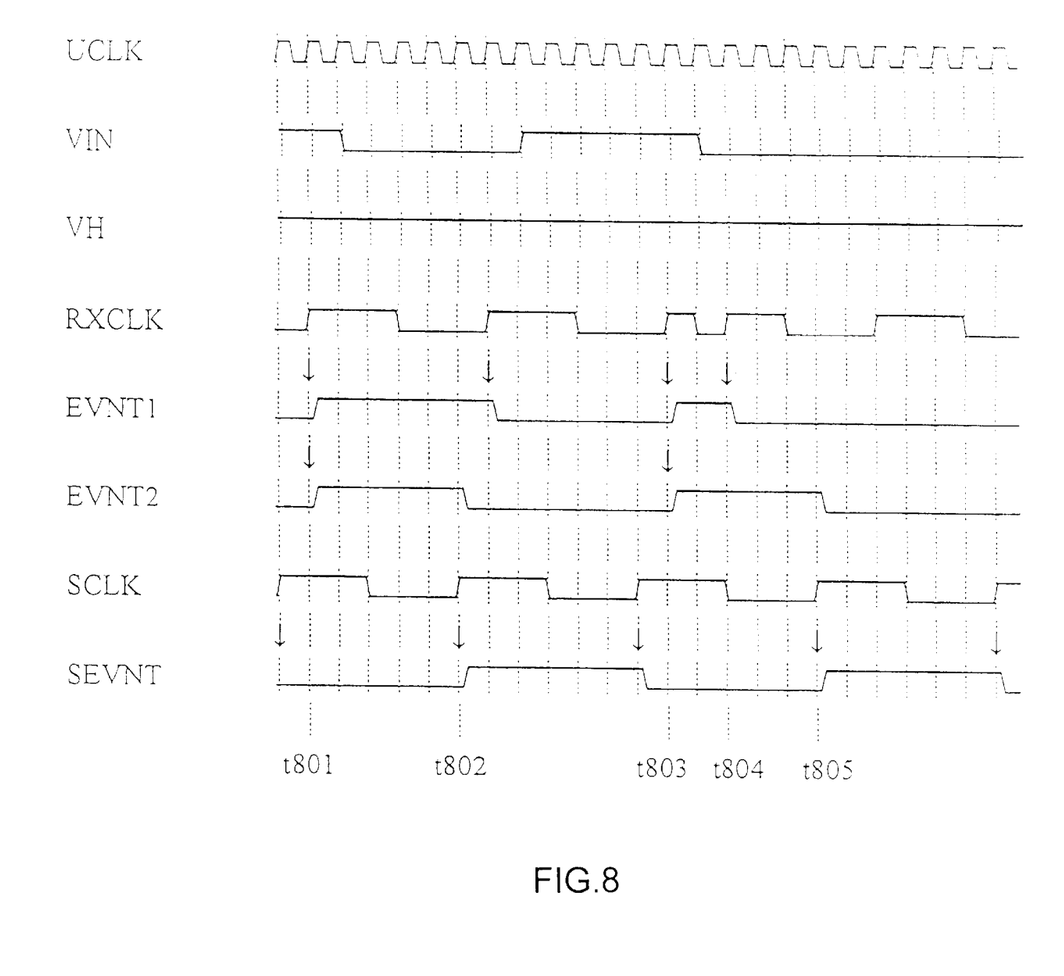
FIG. 8 shows a timing diagram of the jitter-tolerant receiver in FIG. 7.

FIG. 8 is a timing diagram of the jitter-tolerant receiver in FIG. 7. In FIG. 8, a unit clock UCLK can be generated by, for example, a crystal oscillator which is then divided to generate the system clock SCLK. The clock transmitted from a transmitter to a receiver is processed by the Phase Lock Loop (PLL) to produce a receiving clock RXCLK of a frequency equal to that of the transmitter.

Referring to FIG. 7 and FIG. 8 simultaneously, D flip-flop 702 transfers the input signal VIN to event signal EVNT1 from low level to high level at the positive edge of the receiving clock RXCLK. The event signal EVNT1 is thus kept in the same logic level as the input signal VIN for a period of receiving clock RXCLK. For instance, at t801, D flip-flop 702 samples the input signal VIN when the receiving clock RXCLK rises from low level to high level. The event signal EVNT1 rises to high level because of the high level of the input signal VIN.

Meanwhile, at t801, because the event signal EVNT1 changes from low level to high level, D flip-flop 704 transfers the high level signal VH to the event signal EVNN2 to be also of high level. Event signal EVNT2 is kept in high level until the input signal in the reset terminal RST becomes to low level. At t802, the system clock SCLK changes from low level to high level and causes event signal EVNT2 to be sampled by D flip-flop 706. This result in the sampling event SEVNT changing from low level to high level and retained in high level for a period of system clock SCLK. Moreover, because sampling event SEVNT changes to high level, the input signal at reset terminal RST of D flip-flop 704 changes to low level so that the D flip-flop 704 is reset, and the event signal EVNT2 at the output terminal Q2 becomes to low level. The high level signal VH is not sampled again until the event signal EVNT1 changes from low to high level yet again and the event signal EVNT2 changes from low level to high level.

Between t803 and t804, clock draft or signal interference or instability of the system in the process of transmitting data may cause jitters in the receiving clock RXCLK. As shown in FIG. 8, due to the influence of the jitter in the receiving clock RXCLK, D flip-flop 702 generates an event of high level. The event is from t803 to t804. Right after the generation of the high level event, the event signal EVNT1 triggers D flip-flop 704 so that the event signal EVNT2 changes to high level and remains at high level until the input signal of the reset terminal RST of D flip-flop 704 changes to low level. At t805, the system clock SCLK rises from low level to high level, so D flip-flop 706 samples the event signal EVNT2 and causes the sampling event SEVNT to be in high level. This also results in the D flip-flop 704 to reset and the event signal EVNT2 to change low level at the same time.

As is evident from FIG. 8 that the period of the event in event signal EVNT2 would not be effected by the jitter. The period of the event in event signal EVNT2 is a fixed value, which is relative to the moment when the system clock SCLK triggers the D flip-flop 706. Besides, the period of the event in sampling signal SEVNT of D flip-flop 706 is fixed to a period of the system clock SCLK. The circuitry does indeed solve the problem of jitter resulting in events in the sampling event SEVNT to not be lost or erroneous due to the influence of jitters.

In the above description of the present invention, three D flip-flops and one inverter were used in the design of a jitter-tolerant signal receiver. However, the inverter is not an essential component; as long as the feedback of the overall output signal to the second D flip-flop causes it to reset, the goal of the invention is achieved.

Therefore, the characteristic of the invention is to provide a jitter-tolerant receiver device and a method of designing a jitter-tolerant signal receiver. What is needed in the receiver is merely three D flip-flops, and the influence of jitters is eliminated by appropriately controlling the relation of the input and output of every D flip-flops and the reset operation. The number of components used is few, and the structure of the circuit is quite simple, too.

While the invention has been described by way of example and in terms of the preferred embodiment, it is to be understood that the invention is not limited to the disclosed embodiment. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A jitter-tolerant signal receiver, for receiving an input signal of a first clock domain and output a third event signal of a second clock domain in a communication system, which comprising:

a first D flip-flop for receiving the input signal at a first input terminal and a first clock of the first clock domain at a first clock terminal and outputting a first event signal at a first output terminal;

a second D flip-flop for receiving a high level signal at a second input terminal and the first event signal at a second clock terminal and outputting a second event signal at a second output terminal; and a third D flip-flop for receiving the second event signal at a third input terminal and a second clock of the second domain at a third clock terminal, and outputting the third event signal at a third output terminal;

wherein the second D flip-flop further comprises a reset terminal for receiving the third event signal.

2. A signal receiver according to claim 1, wherein the signal receiver further comprises:

an inverter for receiving the third event signal and outputting a signal that is inverted from the third event signal to the reset terminal of the second D flip-flop.

3. A signal receiver device according to claim 1, wherein the first D flip-flop, the second D flip-flop, and the third D flip-flop are all of positive edge-triggered.

4. A signal receiver according to claim 1, wherein the first clock and the second clock are of identical frequency.

5. A signal receiver according to claim 1, wherein the second clock is a system clock of the communication system.

6. A signal receiver according to claim 1, wherein the first clock is generated by a phase lock loop (PLL).

7. A signal receiver according to claim 1, wherein the second clock is generated by dividing a unit clock of the second clock domain.

8. A method of designing a jitter-tolerant signal receiver, for receiving a input signal of a first clock domain and outputting a third event signal of a second clock domain, which comprising:

inputting the input signal to a first D flip-flop which is clocked by a first clock of the first clock domain, wherein when the first clock changes from a first level to a second level, the input signal is transferred to a first signal which is outputted from the first D flip-flop;

inputting a second signal of the first level to a second D flip-flop which is clocked by the first signal, wherein when the first signal changes from the first level to the second level, the second signal is transferred to a third signal which is outputted from the second D flip-flop;

inputting the third signal to a third D flip-flop which is clocked by a second clock of the second clock domain, wherein when the second clock changes from the first level to the second level, the third signal is transferred to the third event signal which is outputted from the third D flip-flop; and inputting the third event signal to a reset terminal of the second D flip-flop, wherein when the third event signal is of the first level, the third signal changes to the second level.

9. A method of designing a jitter-tolerant signal receiver according to claim 8, wherein the first D flip-flop, the second D flip-flop, and the third D flip-flop are all of positive edge-triggered.

10. A method of designing a jitter-tolerant signal receiver according to claim 8, wherein the first level is high level and the second level is low level.

11. A method of designing a jitter-tolerant signal receiver according to claim 8, wherein the first level is low level and the second level is high level.

12. A method of designing a jitter-tolerant signal receiver according to claim 8, wherein the sampling signal event is input to the reset terminal of the second D flip-flop through an inverter.

13. A method of designing a jitter-tolerant signal receiver according to claim 8, wherein the second clock is a system clock.

14. A method of designing a jitter-tolerant signal receiver according to claim 8, wherein the first clock is generated by a phase lock loop (PLL).

15. A method of designing a jitter-tolerant signal receiver according to claim 8, wherein the first clock and the second clock are of the same frequency.

* * * * *